(12) United States Patent
Yamanishi et al.

(10) Patent No.: US 10,840,406 B2
(45) Date of Patent: Nov. 17, 2020

(54) OPTICAL SEMICONDUCTOR ELEMENT AND METHOD OF DRIVING OPTICAL SEMICONDUCTOR ELEMENT

(71) Applicant: HAMAMATSU PHOTONICS K.K., Hamamatsu (JP)

(72) Inventors: Masamichi Yamanishi, Hamamatsu (JP); Akira Higuchi, Hamamatsu (JP); Toru Hirohata, Hamamatsu (JP); Kazunori Tanaka, Hamamatsu (JP); Kazuue Fujita, Hamamatsu (JP); Yasufumi Takagi, Hamamatsu (JP); Yuta Aoki, Hamamatsu (JP); Satoru Okawara, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 94 days.

(21) Appl. No.: 15/903,200

(22) Filed: Feb. 23, 2018

(65) Prior Publication Data

US 2018/0301591 A1    Oct. 18, 2018

(30) Foreign Application Priority Data

Apr. 17, 2017    (JP) ................................. 2017-081473

(51) Int. Cl.
*H01L 33/06* (2010.01)
*H01L 33/20* (2010.01)
(Continued)

(52) U.S. Cl.
CPC ...... *H01L 33/0045* (2013.01); *H01L 33/0025* (2013.01); *H01L 33/06* (2013.01);
(Continued)

(58) Field of Classification Search
CPC . H01L 33/0025; H01L 33/0045; H01L 33/06; H01L 33/20; H01L 33/30;
(Continued)

(56) References Cited

U.S. PATENT DOCUMENTS 3,996,492 A * 12/1976 McGroddy ............... H01S 5/18
372/93
4,658,402 A * 4/1987 Kobayashi .............. G02F 3/026
372/108

(Continued)

FOREIGN PATENT DOCUMENTS

JP    H04-259262 A    9/1992
JP    H05-121725 A    5/1993
(Continued)

*Primary Examiner* — Mary A Wilczweski
(74) *Attorney, Agent, or Firm* — Faegre Drinker Biddle & Reath LLP (57) ABSTRACT

An optical semiconductor element includes: an optical waveguide body; a first electrode that is disposed on the second clad layer; a second electrode that is disposed on a second clad layer on one side of the first electrode in a light guiding direction of the optical waveguide body; a third electrode that is disposed on the second clad layer on the other side of the first electrode in the light guiding direction; and at least one fourth electrode that faces the first electrode, the second electrode, and the third electrode with the optical waveguide body interposed therebetween. The optical waveguide body includes a first separation region that electrically separates a first region under the first electrode from a second region under the second electrode and a second separation region that electrically separates the first region under the first electrode and a third region under the third electrode.

10 Claims, 10 Drawing Sheets

(51) Int. Cl.
*H01L 33/30* (2010.01)
*H01L 33/32* (2010.01)
*H01L 33/38* (2010.01)
*H01L 33/46* (2010.01)
*H05B 33/08* (2020.01)
*H01L 33/00* (2010.01)
*H05B 45/00* (2020.01)

(52) U.S. Cl.
CPC ............. *H01L 33/20* (2013.01); *H01L 33/30* (2013.01); *H01L 33/325* (2013.01); *H01L 33/46* (2013.01); *H05B 45/00* (2020.01); *H01L 33/38* (2013.01)

(58) Field of Classification Search
CPC ....... H01L 33/325; H01L 33/38; H01L 33/46; H05B 45/00
See application file for complete search history.

(56) References Cited

U.S. PATENT DOCUMENTS

| | | | | |
|---|---|---|---|---|
| 4,797,891 A * | 1/1989 | Uomi | ............... | H01S 5/4031 372/45.01 |
| 4,883,771 A * | 11/1989 | Kumabe | ............ | H01S 5/164 438/33 |
| 5,084,894 A * | 1/1992 | Yamamoto | ............ | B82Y 20/00 372/26 |
| 5,088,097 A * | 2/1992 | Ono | ............... | H01S 5/5045 372/20 |
| 5,155,736 A * | 10/1992 | Ono | ............... | B82Y 20/00 372/20 |
| 5,334,854 A * | 8/1994 | Ono | ............... | H01S 5/06206 257/13 |
| 5,388,106 A * | 2/1995 | Tabuchi | ............ | H01S 5/06255 372/20 |
| 5,521,754 A * | 5/1996 | Nitta | ............... | H04B 10/2914 359/344 |
| 5,568,311 A * | 10/1996 | Matsumoto | ............ | B82Y 20/00 359/344 |
| 5,926,497 A * | 7/1999 | Nitta | ............... | H01S 5/0625 372/102 |
| 6,198,853 B1 * | 3/2001 | Yamada | ............ | G02F 1/025 257/458 |
| 6,415,083 B1 * | 7/2002 | Anderson | ............ | G02B 6/13 385/1 |
| 6,771,682 B2 * | 8/2004 | Peters | ............ | B82Y 20/00 372/50.1 |
| 6,862,136 B2 * | 3/2005 | Koren | ............... | H01S 5/5018 359/337.4 |
| 7,142,343 B2 * | 11/2006 | Kim | ............... | H01S 5/0264 359/245 |
| 7,688,870 B2 * | 3/2010 | Oh | ............... | H01L 33/0045 372/1 |
| 8,334,393 B2 * | 12/2012 | Goldfinger | ............ | C07D 493/04 549/464 |
| 8,629,461 B2 * | 1/2014 | Imai | ............... | H01L 27/15 257/84 |
| 9,966,500 B2 * | 5/2018 | Watanabe | ............ | H01L 33/14 |
| 10,109,762 B2 * | 10/2018 | Yamagata | ............ | H01L 33/0045 |
| 2002/0050596 A1 * | 5/2002 | Otsuka | ............ | H01S 5/0422 257/81 |
| 2002/0136259 A1 * | 9/2002 | Evans | ............... | H01S 5/187 372/102 |
| 2003/0146440 A1 * | 8/2003 | Murata | ............ | H01S 5/0265 257/79 |
| 2003/0169796 A1 * | 9/2003 | Nakamura | ............ | H01S 5/02284 372/46.01 |
| 2003/0198269 A1 * | 10/2003 | Wesstrom | ............ | H01S 5/06256 372/50.1 |
| 2004/0086015 A1 * | 5/2004 | Kawahara | ............ | H01S 5/0265 372/45.01 |
| 2006/0285570 A1 * | 12/2006 | Xuan | ............... | H01S 5/1021 372/68 |
| 2009/0072243 A1 * | 3/2009 | Suda | ............ | H01L 21/8258 257/77 |
| 2010/0117104 A1 * | 5/2010 | Murata | ............ | H01S 5/0265 257/94 |
| 2010/0283063 A1 * | 11/2010 | Imai | ............... | H01L 27/15 257/84 |
| 2013/0092959 A1 * | 4/2013 | Imai | ............... | H01L 27/15 257/84 |
| 2014/0218701 A1 * | 8/2014 | Nishioka | ............ | G03B 21/2033 353/99 |
| 2014/0240682 A1 * | 8/2014 | Nishioka | ............ | G03B 21/208 353/98 |
| 2015/0155683 A1 * | 6/2015 | Blauvelt | ............ | H01S 5/06251 385/2 |
| 2018/0301591 A1 * | 10/2018 | Yamanishi | ............ | H01L 33/0025 |

FOREIGN PATENT DOCUMENTS

| | | | | |
|---|---|---|---|---|
| JP | 2007-158063 | * | 6/2007 | ............ H01S 5/2231 |
| WO | WO 2019/111804 | * | 6/2019 | ............ H01L 33/381 |
| WO | WO 2019/111805 | * | 6/2019 | ............ H01L 33/14 |

\* cited by examiner

OPTICAL SEMICONDUCTOR ELEMENT AND METHOD OF DRIVING OPTICAL SEMICONDUCTOR ELEMENT

TECHNICAL FIELD

The present disclosure relates to an optical semiconductor element and a method of driving an optical semiconductor element.

BACKGROUND

A super luminescent diode (hereinafter referred to as an "SLD") has attracted attention as a light source that can generate output light with an excellent light condensing ability and a wide spectrum. As an SLD, for example, an end-face light emitting diode in which an optical waveguide body with a double heterostructure is electrically separated into a light emitting region and an optical loss region by an ion injection region is described in Japanese Unexamined Patent Publication No. H4-259262.

On the other hand, a light source that can modulate output light at a high speed (for example, with a pulse width at a subnanosecond level) is anticipated. As such a light source, for example, an optical semiconductor element in which an optical waveguide body with a double heterostructure fixed to a sub mount is physically separated into a laser diode section and an optical modulation section by a cleavage is described in Japanese Unexamined Patent Publication No. H5-121725.

SUMMARY

In order to realize fast modulation of output light with an excellent light condensing ability and a wide spectrum, it is conceivable that a configuration of the laser diode section in the optical semiconductor element described in Japanese Unexamined Patent Publication No. H5-121725 is replaced with a configuration of the end-face light emitting diode described in Japanese Unexamined Patent Publication No. H4-259262. However, it is difficult to realize fast modulation of output light with an excellent light condensing ability and a wide spectrum just by simply performing such replacement.

An object of the present disclosure is to provide an optical semiconductor element that can generate output light with an excellent light condensing ability and a wide spectrum and modulate the output light at a high speed and a method of driving the optical semiconductor element.

According to the present disclosure, there is provided an optical semiconductor element including: an optical waveguide body that is configured as a double heterostructure including an active layer and a first clad layer and a second clad layer between which the active layer is interposed; a first electrode that is disposed on the second clad layer; a second electrode that is disposed on the second clad layer on one side of the first electrode in a light guiding direction of the optical waveguide body; a third electrode that is disposed on the second clad layer on other side of the first electrode in the light guiding direction of the optical waveguide body; and at least one fourth electrode that faces the first electrode, the second electrode, and the third electrode with the optical waveguide body interposed therebetween, wherein the optical waveguide body includes a first separation region that electrically separates a first region under the first electrode from a second region under the second electrode and a second separation region that electrically separates the first region under the first electrode and a third region under the third electrode.

In the optical semiconductor element, by applying a forward bias between the at least one fourth electrode and the first electrode so that the first region serves as a gain region, and applying a reverse bias between the at least one fourth electrode and the second electrode so that the second region serves as a loss region, it is possible to generate output light with an excellent light condensing ability and a wide spectrum. By alternately applying a first bias and a second bias having different magnitudes between the at least one fourth electrode and the third electrode so that the third region serves as a modulation region, it is possible to modulate the output light output to the third region side at a high speed. Particularly, the output light output to the third region has a wide spectrum, but because the first region and the third region are electrically separated by the second separation region and a continuous optical waveguide is formed, it is possible to prevent generation of optical loss in all bands of the spectrum and to modulate the output light at a high speed. Accordingly, with the optical semiconductor element, it is possible to generate output light with an excellent light condensing ability and a wide spectrum and to modulate the output light at a high speed.

In the optical semiconductor element according to the present disclosure, each of the first separation region and the second separation region may include an ion injection region, an impurity diffusion region, or a semiconductor region of a conduction type different from the conduction type of the second clad layer. According to this configuration, it is possible to preferably achieve electrical separation between the first region and the second region and electrical separation between the first region and the third region.

In the optical semiconductor element according to the present disclosure, each of the first separation region and the second separation region may extend from a surface of the second clad layer to the first clad layer. According to this configuration, it is possible to more preferably achieve electrical separation between the first region and the second region and electrical separation between the first region and the third region.

In the optical semiconductor element according to the present disclosure, the first region may serve as a gain region by applying a forward bias between the first electrode and the at least one fourth electrode, the second region may serve as a loss region by applying a reverse bias between the second electrode and the at least one fourth electrode, and the third region may serve as a modulation region by alternately applying a first bias and a second bias having different magnitudes between the third electrode and the at least one fourth electrode. According to this configuration, as described above, it is possible to generate output light with an excellent light condensing ability and a wide spectrum and to modulate the output light at a high speed.

In the optical semiconductor element according to the present disclosure, the first bias is a forward bias and the second bias is a reverse bias. According to this configuration, the third region can serve as a modulation region by alternately applying a forward bias and a reverse bias between the at least one fourth electrode and the third electrode.

In the optical semiconductor element according to the present disclosure, the first bias and the second bias may be reverse biases. According to this configuration, the third region can serve as a modulation region by alternately applying reverse biases having different magnitudes between the at least one fourth electrode and the third electrode.

In the optical semiconductor element according to the present disclosure, an end face on a side opposite to the first region in the third region may be a face perpendicular to the light guiding direction. According to this configuration, because a beam pattern of the output light emitted from the end face is improved, it is possible to obtain output light with a superior light condensing ability.

In the optical semiconductor element according to the present disclosure, a low-reflection layer may be disposed on an end face on a side opposite to the first region in the third region. According to this configuration, it is possible to prevent generation of optical loss due to reflection of a part of the output light by the end face which serves as an emission face of the output light.

The optical semiconductor element according to the present disclosure may further include a substrate on which the optical waveguide body is disposed. According to this configuration, it is possible to improve the handleability of the optical semiconductor element.

In the optical semiconductor element according to the present disclosure, the optical waveguide body may be formed in a ridge structure on the substrate. According to this configuration, it is possible to simplify a configuration of the optical waveguide body.

In the optical semiconductor element according to the present disclosure, a length of the third region in the light guiding direction may be shorter than a length of the first region and of the second region in the light guiding direction. According to this configuration, for example, in a comparison with a case in which the length of the third region in the light guiding direction is longer than the length of the first region and of the second region in the light guiding direction, an absorption loss resulting from indwelling impurities and crystal defects decreases in the third region serving as a modulation region and thus a quenching ratio during a modulation operation increases.

According to the present disclosure, there is also provided a method of driving an optical semiconductor element, the optical semiconductor element including: an optical waveguide body that is configured as a double heterostructure including an active layer and a first clad layer and a second clad layer between which the active layer is interposed; a first electrode that is disposed on the second clad layer; a second electrode that is disposed on the second clad layer on one side of the first electrode in a light guiding direction of the optical waveguide body; a third electrode that is disposed on the second clad layer on other side of the first electrode in the light guiding direction of the optical waveguide body; and at least one fourth electrode that faces the first electrode, the second electrode, and the third electrode with the optical waveguide body interposed therebetween, wherein the optical waveguide body includes a first separation region that electrically separates a first region under the first electrode from a second region under the second electrode and a second separation region that electrically separates the first region under the first electrode and a third region under the third electrode, the method including: steps of applying a forward bias between the first electrode and the at least one fourth electrode so that the first region serves as a gain region, applying a reverse bias between the second electrode and the at least one fourth electrode so that the second region serves as a loss region, and alternately applying a first bias and a second bias having different magnitudes between the third electrode and the at least one fourth electrode so that the third region serves as a modulation region.

In the method of driving an optical semiconductor element, by applying a forward bias between the at least one fourth electrode and the first electrode so that the first region serves as a gain region, and applying a reverse bias between the at least, one fourth electrode and the second electrode so that the second region serves as a loss region, it is possible to generate output light with an excellent light condensing ability and a wide spectrum. By alternately applying a first bias and a second bias having different magnitudes between the at least one fourth electrode and the third electrode so that the third region serves as a modulation region, it is possible to modulate the output light output to the third region side at a high speed. Particularly, the output light output to the third region has a wide spectrum, but because the first region and the third region are electrically separated by the second separation region and a continuous optical waveguide is formed, it is possible to prevent generation of optical loss in all bands of the spectrum and to modulate the output light at a high speed. Accordingly, with the method of driving the optical semiconductor element, it is possible to generate output light with an excellent light condensing ability and a wide spectrum and to modulate the output light at a high speed.

In the method of driving an optical semiconductor element according to the present disclosure, the first bias is a forward bias and the second bias is a reverse bias. According to this configuration, the third region can serve as a modulation region by alternately applying a forward bias and a reverse bias between the at least one fourth electrode and the third electrode.

In the method of driving an optical semiconductor element according to the present disclosure, the first bias and the second bias may be reverse biases. According to this configuration, the third region can serve as a modulation region by alternately applying reverse biases having different magnitudes between the at least one fourth electrode and the third electrode.

According to the present disclosure, it is possible to provide an optical semiconductor element that can generate output light with an excellent light condensing ability and a wide spectrum and modulate the output light at a high speed and a method of driving the optical semiconductor element.

DETAILED DESCRIPTION

Hereinafter, embodiments of the invention will be described in detail with reference to the accompanying drawings. In the drawings, the same or corresponding elements will be referred to by the same reference signs and description thereof will not be repeated.

Figure 1:
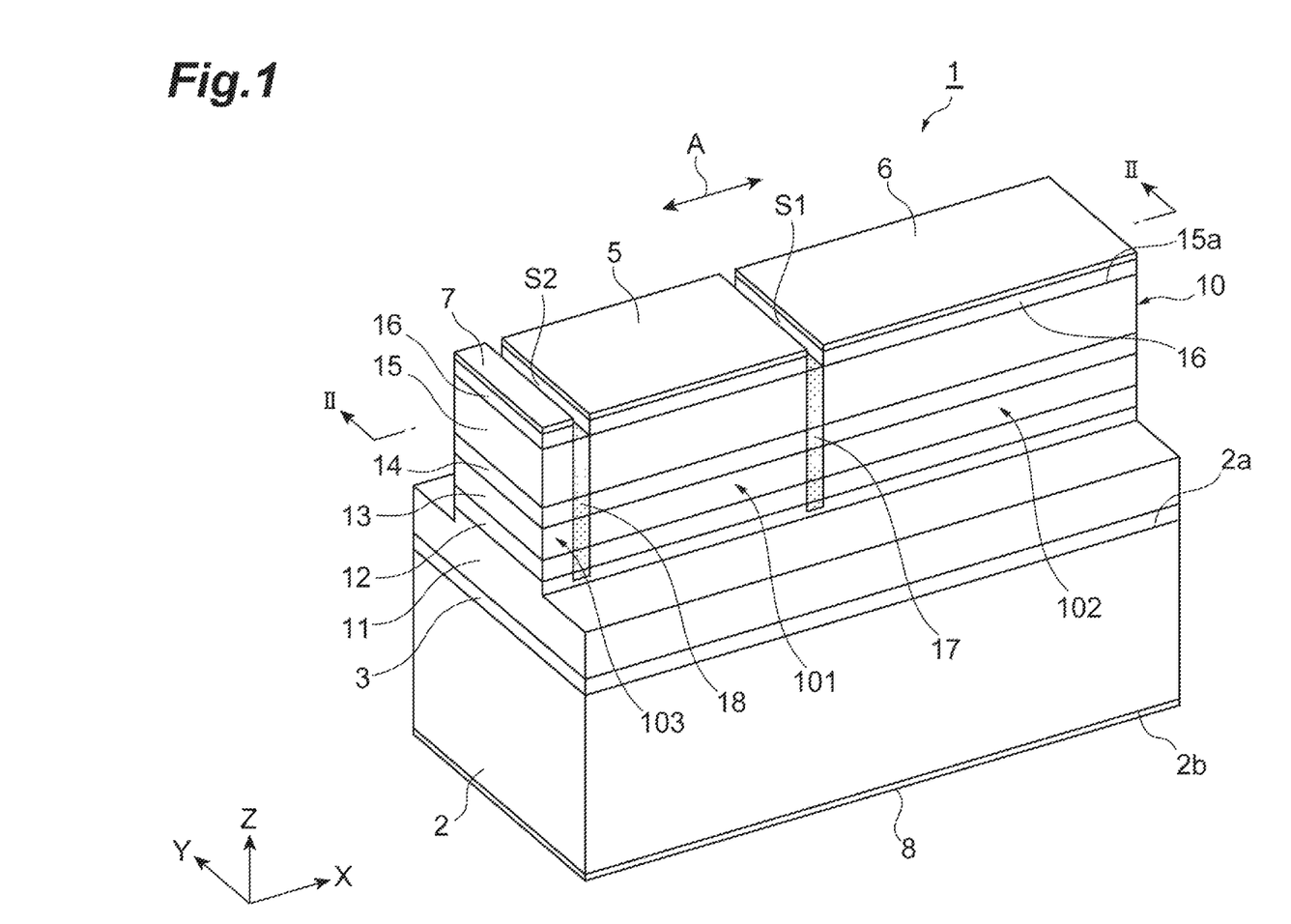
FIG. 1 is a perspective view of an optical semiconductor element according to an embodiment.
Figure 2:
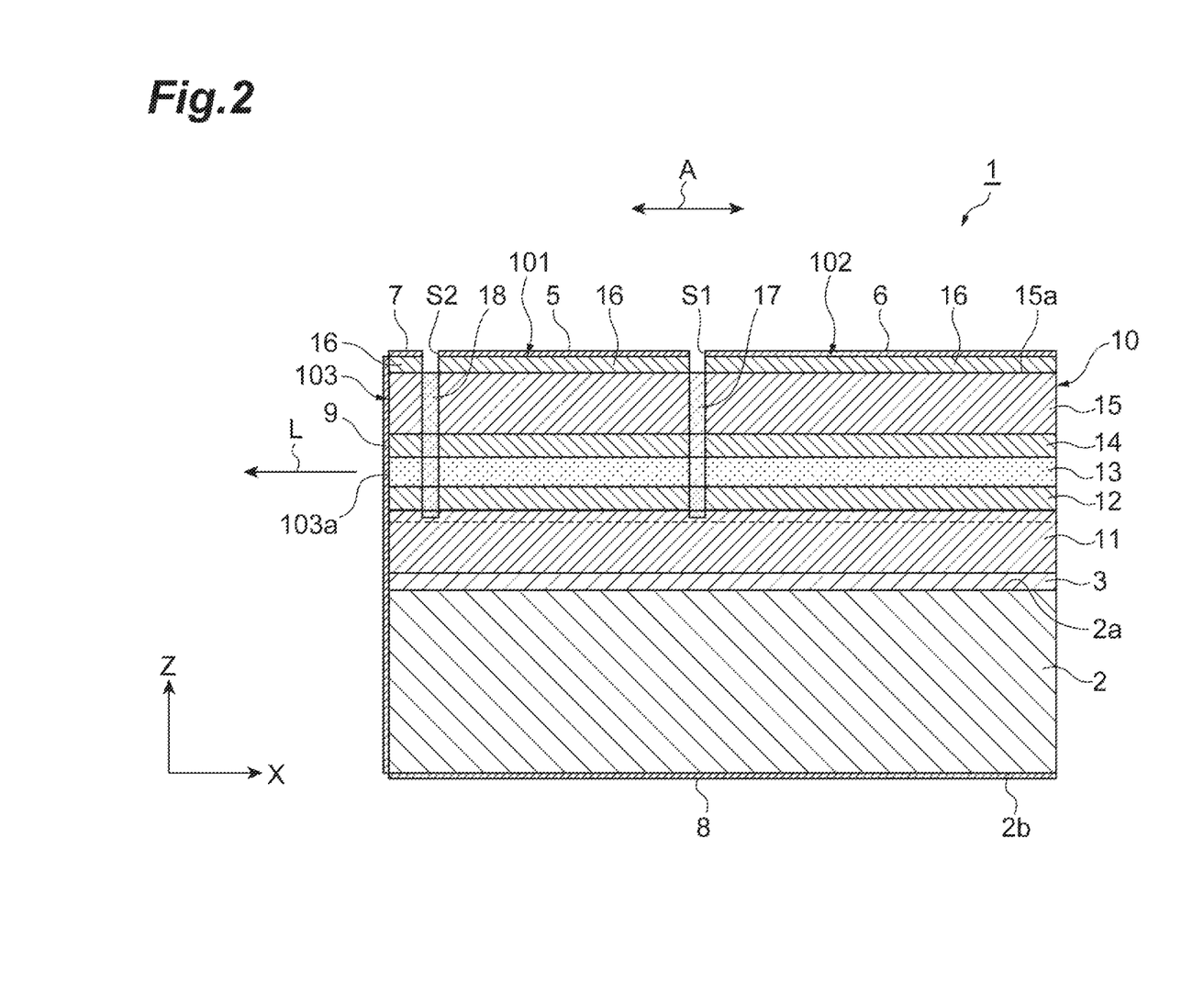
FIG. 2 is a sectional view taken along line II-II in FIG. 1.

As illustrated in FIGS. 1 and 2, an optical semiconductor element 1 includes a substrate 2 and an optical waveguide body 10. The optical waveguide body 10 is disposed on a surface 2a of the substrate 2 with a buffer layer 3 interposed therebetween. The substrate 2 and the buffer layer 3 are formed of, for example, n− type GaAs. The substrate 2 has, for example, a rectangular panel shape with a length of 1.5 mm to 6.0 mm, a width of 300 μm to 1000 μm, and a thickness of 100 μm to 600 μm. Hereinafter, a length direction of the substrate 2 is defined as an X-axis direction, a width direction of the substrate 2 is defined as a Y-axis direction, and a thickness direction of the substrate 2 is defined as a Z-axis direction.

The optical waveguide body 10 is configured by stacking a first clad layer 11, a first guide layer 12, an active layer 13, a second guide layer 14, a second clad layer 15, and a contact layer 16 on the buffer layer 3 in this order. The optical waveguide body 10 is configured as a double heterostructure including the active layer 13 and the first clad layer 11 and the second clad layer 15 between which the active layer 13 is interposed. The first clad layer 11 is formed of, for example, n− type $Al_{0.3}Ga_{0.7}As$. The first guide layer 12 is formed of, for example, non-doped $Al_{0.25}Ga_{0.75}As$. The active layer 13 has, for example, a multiple quantum well structure of $GaAs/Al_{0.2}Ga_{0.8}As$. The second guide layer 14 is formed of, for example, non-doped $Al_{0.25}Ga_{0.75}As$. The second clad layer 15 is formed of, for example, p− type $Al_{0.3}Ga_{0.7}As$. The contact layer 16 is formed of, for example, p+ type GaAs.

The optical waveguide body 10 is formed in a ridge structure on the substrate 2. A light guiding direction A of the optical waveguide body 10 is a direction which is parallel to the X-axis direction. For example, the width of the optical waveguide body 10 may be smaller than the width of the substrate 2 and the buffer layer 3 except for a part of the first clad layer 11 close to the buffer layer 3. In the ridge structure part, the optical waveguide body 10 has, for example, a rectangular plate shape (a layer shape) with a length of about 1.5 mm to 6.0 mm, a width of about 2 μm to 50 μm, and a thickness of about 1 μm to 2 μm. The light guiding direction A is a direction parallel to the center line of a tubular region (a region which is formed by the first clad layer 11, the second clad layer 15, and an air layer in the ridge structure) for confining light thereto, that is, a direction in which the active layer 13 surrounded by the tubular region extends.

The optical semiconductor element 1 further includes a first electrode 5, a second electrode 6, a third electrode 7, and a fourth electrode 8. The first electrode 5, the second electrode 6, and the third electrode 7 are disposed on the second clad layer 15 with the contact layer 16 interposed therebetween, and are electrically connected to the second clad layer 15 just thereunder via the contact layer 16. The fourth electrode 8 is disposed on a rear surface 2b of the substrate 2 and is electrically connected to the substrate 2. The first electrode 5, the second electrode 6, the third electrode 7, and the fourth electrode 8 are formed of, for example, Au-based metal.

The first electrode 5, the second electrode 6, and the third electrode 7 are arranged in the light guiding direction A. The second electrode 6 is located on one side of the first electrode 5 in the light guiding direction A. The third electrode 7 is located on the other side of the first electrode 5 in the light guiding direction A. The fourth electrode 8 faces the first electrode 5, the second electrode 6, and the third electrode 7 with the substrate 2, the buffer layer 3, and the optical waveguide body 10 interposed therebetween.

A gap S1 that extends in the Y-axis direction is formed between the first electrode 5 and the second electrode 6, and the contact layer 16 is physically separated along the gap S1. A gap S2 that extends in the Y-axis direction is formed between the first electrode 5 and the third electrode 7, and the contact layer 16 is physically separated along the gap S2. That is, the first electrode 5, the second electrode 6, and the third electrode 7 are formed by separating a metal layer which is formed to cover the whole top surface of the optical waveguide body 10 (the surface opposite to the fourth electrode 8) using the gap S1 and the gap S2. In other words, the first electrode 5, the second electrode 6, and the third electrode 7 are formed to cover the whole region other than the gap S1 and the gap S2 of the top surface of the optical waveguide body 10. The contact layer 16 is separated using the gaps S1 and S2 into the parts just under the first electrode 5, the second electrode 6, and the third electrode 7.

A first ion injection region 17 and a second ion injection region 18 are provided in the optical waveguide body 10. The first ion injection region 17 electrically separates a first region 101 under the first electrode 5 and a second region 102 under the second electrode 6 in the optical waveguide body 10. The second ion injection region 18 electrically separates the first region 101 under the first electrode 5 and a third region 103 under the third electrode 7 in the optical waveguide body 10.

The first region 101 is a region which overlaps the first electrode 5 in the optical waveguide body 10 when viewed in the Z-axis direction and is a region which is interposed between the fourth electrode 8 and the first electrode 5 in the optical waveguide body 10. The second region 102 is a region which overlaps the second electrode 6 in the optical waveguide body 10 when viewed in the Z-axis direction and is a region which is interposed between the fourth electrode 8 and the second electrode 6 in the optical waveguide body 10. The third region 103 is a region which overlaps the third electrode 7 in the optical waveguide body 10 when viewed in the Z-axis direction and is a region which is interposed between the fourth electrode 8 and the third electrode 7 in the optical waveguide body 10.

The first ion injection region 17 is formed at a position corresponding to the gap S1 (at a position in the light guiding direction A) in the optical waveguide body 10 and extends along a face perpendicular to the light guiding direction A. The second ion injection region 18 is formed at a position corresponding to the gap S2 (at a position in the light guiding direction A) in the optical waveguide body 10 and extends along a face perpendicular to the light guiding direction A. The first ion injection region 17 extends from a surface 15a of the second clad layer 15 to the first clad layer 11 in the Z-axis direction and extends to both side surfaces of the optical waveguide body 10 in the Y-axis direction. Similarly, the second ion injection region 18 extends from the surface 15a of the second clad layer 15 to the first clad layer 11 in the Z-axis direction and extends to both side surfaces of the optical waveguide body 10 in the Y-axis direction.

The thicknesses of the first ion injection region 17 and the second ion injection region 18 (the widths in the light guiding direction A) range from about 10 µm to 50 µm. The first ion injection region 17 and the second ion injection region 18 are formed, for example, by adding protons, boron, or the like to the optical waveguide body 10 by ion implantation.

The length of the third region 103 in the light guiding direction A is shorter than the length of the first region 101 and of the second region 102 in the light guiding direction A. The length of the first region 101 in the light guiding direction A ranges, for example, from 0.5 mm to 3.0 mm. The length of the second region 102 in the light guiding direction A ranges, for example, from about 0.8 mm to 2.0 mm. The length of the third region 103 in the light guiding direction A ranges, for example, from about 0.2 mm to 0.5 mm.

A low-reflection layer 9 is provided on an end face 103a of the third region 103 opposite to the first region 101. The end face 103a is an emission face of output light L and a face which is perpendicular to the light guiding direction A. The low-reflection layer 9 prevents a part of the output light L from being reflected by the end face 103a and being returned into the optical waveguide body 10. The low-reflection layer 9 is, for example, a dielectric multilayer which is referred to as an AR coating. The low-reflection layer 9 is not illustrated in FIG. 1.

Figure 3A:
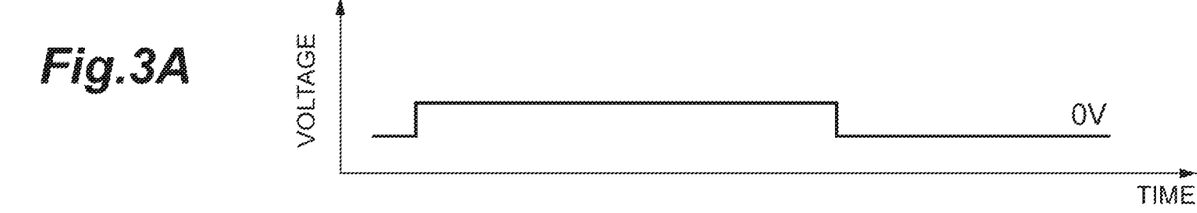
FIGS. 3A, 3B, 3C, and 3D are timing charts of the optical semiconductor element illustrated in FIG. 1.
Figure 3B:
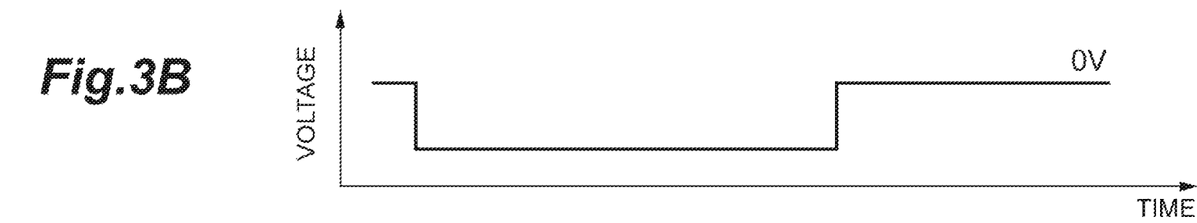

In the optical semiconductor element 1 having the above-mentioned configuration, a forward bias is applied between the fourth electrode 8 and the first electrode 5. That is, a first bias which is a forward bias and a second bias which is a reverse bias are alternately applied between the fourth electrode 8 and the third electrode 7. Specifically, as illustrated in FIG. 3A, a positive voltage (for example, +1.5 V to +2.0 V) is applied to the first electrode 5 with the fourth electrode 8 set to the ground potential. Accordingly, the first region 101 serves as a gain region, and the gain region serves as a laser diode and oscillates light. On the other hand, a reverse bias is applied between the fourth electrode 8 and the second electrode 6. Specifically, as illustrated in FIG. 3B, a negative voltage (for example, −5 V) is applied to the second electrode 6 with the fourth electrode 8 set to the ground potential. Accordingly, the second region 102 serves as a loss region and the loss region serves as a laser diode and stops oscillation of light. Accordingly, the first region 101 and the second region 102 serve as an SLD and generate output light L with an excellent light condensing ability and a wide spectrum.

Figure 3C:
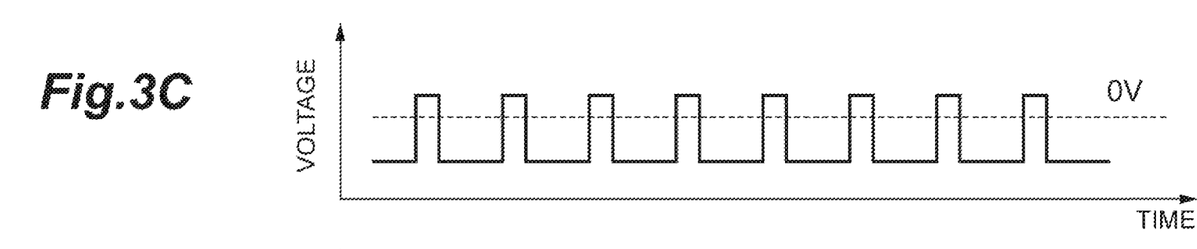
Figure 3D:
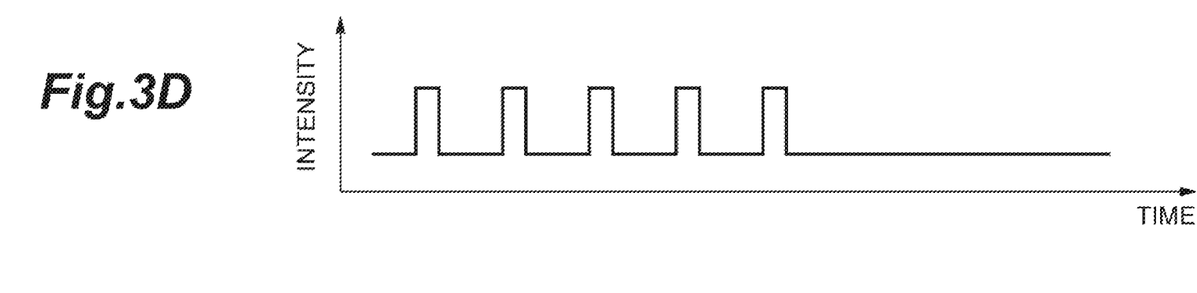

At this time, a forward bias and a reverse bias are alternately applied between the fourth electrode 8 and the third electrode 7. Specifically, as illustrated in FIG. 3C, a positive voltage (for example, +1 V) and a negative voltage (for example, −5 V) are alternately applied to the third electrode 7 in cycles at a subnanosecond level with the fourth electrode 8 set to the ground potential. Accordingly, the third region 103 serves as a modulation region, and the modulation region modulates the output light L at a high speed. Specifically, as illustrated in FIG. 3D, the output light L emitted from the end face 103a of the third region 103 in the light guiding direction A is modulated with a pulse width at a subnanosecond level. When a forward bias is applied between the fourth electrode 8 and the first electrode 5 and between the fourth electrode 8 and the second electrode 6, both of the first region 101 and the second region 102 can serve as gain regions, and the gain regions can serve as a laser diode and oscillate light.

As described above, in the optical semiconductor element 1, the output light L with an excellent light condensing ability and a wide spectrum can be generated by applying a forward bias between the fourth electrode 8 and the first electrode 5 so that the first region 101 serves as a gain region and applying a reverse bias between the fourth electrode 8 and the second electrode 6 so that the second region 102 serves as a loss region. By alternately applying a forward bias and a reverse bias between the fourth electrode 8 and the third electrode 7 so that the third region 103 serves as a modulation region, the output light L output to the third region 103 can be modulated at a high speed. Particularly, the output light L output to the third region 103 has a wide spectrum, but because the first region 101 and the third region 103 are electrically separated by the second ion injection region 18 and a continuous optical waveguide is formed, it is possible to prevent generation of optical loss in the whole band of the spectrum and to modulate the output light L at a high speed. Accordingly, with the optical semiconductor element 1, it is possible to generate output light L with an excellent light condensing ability and a wide spectrum and to modulate the output light L at a high speed.

In the optical semiconductor element 1, the first ion injection region 17 and the second ion injection region 18 extend from the surface 15a of the second clad layer 15 to the first clad layer 11. Accordingly, it is possible to preferably realize electrical separation between the first region 101 and the second region 102 and electrical separation between the first region 101 and the third region 103.

In the optical semiconductor element 1, the end face 103a of the third region 103 is a face perpendicular to the light guiding direction A. Accordingly, because a beam pattern of the output light L emitted from the end face 103a is improved, it is possible to obtain output light L with a superior light condensing ability.

In the optical semiconductor element 1, the low-reflection layer 9 is provided on the end face 103a of the third region 103. Accordingly, it is possible to prevent generation of optical loss due to reflection of a part of the output light L by the end face 103a which serves as an emission face of the output light L.

In the optical semiconductor element 1, the optical waveguide body 10 is provided on the substrate 2. Accordingly, it is possible to improve handleability of the optical semiconductor element 1.

In the optical semiconductor element 1, the optical waveguide body 10 is formed in a ridge structure on the substrate 2. Accordingly, it is possible to simplify the configuration of the optical waveguide body 10.

In the optical semiconductor element 1, the length of the third region 103 in the light guiding direction A is shorter than the lengths of the first region 101 and of the second region 102 in the light guiding direction A. Accordingly, for example, in a comparison with a case in which the length of the third region 103 in the light guiding direction A is longer than the length of the first region 101 and of the second region 102 in the light guiding direction A, an absorption loss resulting from indwelling impurities and crystal defects decreases in the third region 103 serving as a modulation region and thus a quenching ratio at the time of a modulation operation increases. The decrease in the length of the third region 103 in the light guiding direction A provides an advantage in view of productivity and mass productivity.

In the optical semiconductor element 1, the optical waveguide body 10 is monolithically formed on the substrate 2, and the optical waveguide body 10 is electrically separated into the first region 101, the second region 102, and the third region 103 by the first ion injection region 17 and the second ion injection region 18. Accordingly, it is possible to easily and surely form the first region 101, the second region 102, and the third region 103 having the same layer structure. For example, the alignment which is required when the first region 101, the second region 102, and the third region 103 are formed as separate bodies is not necessary. Electrical separation of the optical waveguide body 10 into the first region 101, the second region 102, and the third region 103 by the first ion injection region 17 and the second ion injection region 18 is important in preventing inducing a resonance state due to feedback of guided light at a discontinuous refractive index point.

The third electrode 7, the fourth electrode 8, and the dielectric materials (the substrate 2, the buffer layer 3, and the optical waveguide body 10) interposed between the third electrode 7 and the fourth electrode 8 may form a microstrip waveguide and the thickness of the dielectric material interposed between the third electrode 7 and the fourth electrode 8 may be set such that a characteristic impedance of the microstrip waveguide matches a characteristic impedance of a signal line in which a voltage applied to the third electrode 7 propagates. When the thickness of the substrate 2 is dominant in the thickness of the dielectric material as in the above-mentioned embodiment, this matching can be suitably achieved by adjusting the thickness of the substrate 2. In this case, a voltage signal for modulation is applied to the third electrode 7 without unsharpening a waveform and thus high-speed response may be expected. In the embodiment, because the optical waveguide body 10 is formed in a ridge structure, a microstrip waveguide is suitably formed. The characteristic impedance of the microstrip waveguide can be calculated by the following equation, and can be set to the same characteristic impedance (for example, 50Ω) as the signal line depending on parameters. In the following equation, Z0 denotes a characteristic impedance of a microstrip waveguide, εr denotes a relative dielectric constant of a dielectric material, H denotes a thickness of a dielectric material, W denotes a width of an upper electrode (the third electrode 7), and T denotes a thickness of the upper electrode.

$$Z0 = \frac{87}{\sqrt{\varepsilon r + 1.41}} \times \ln\left(\frac{5.98 \times H}{0.8 \times W + T}\right) \qquad [\text{Equation 1}]$$

While an embodiment of the invention has been described above, the invention is not limited to the embodiment. For example, in the above-mentioned embodiment, one fourth electrode 8 serving as a common electrode faces the first electrode 5, the second electrode 6, and the third electrode 7, but a plurality of fourth electrodes 8 may face the first electrode 5, the second electrode 6, and the third electrode 7. In the above-mentioned embodiment, the optical waveguide body 10 is configured as a ridge structure, but the optical waveguide body 10 may be configured in an embedded structure. In this case, also, a direction parallel to the center line of the tubular region for confining light thereto, that is, a direction in which the active layer 13 surrounded by the tubular region extends, is the light guiding direction A.

As reference, other embodiments will be described below. An optical semiconductor element 1A illustrated in FIG. 4 includes a substrate 2, a first optical waveguide body 20, and a second optical waveguide body 30. The first optical waveguide body 20 and the second optical waveguide body 30 are disposed on the substrate 2 in a state in which they are arranged in the X-axis direction. The layer structure of each of the first optical waveguide body 20 and the second optical waveguide body 30 is the same as the above-mentioned layer structure of the optical waveguide body 10 of the optical semiconductor element 1. The light guiding direction A of each of the first optical waveguide body 20 and the second optical waveguide body 30 is parallel to the X-axis direction.

Figure 4:
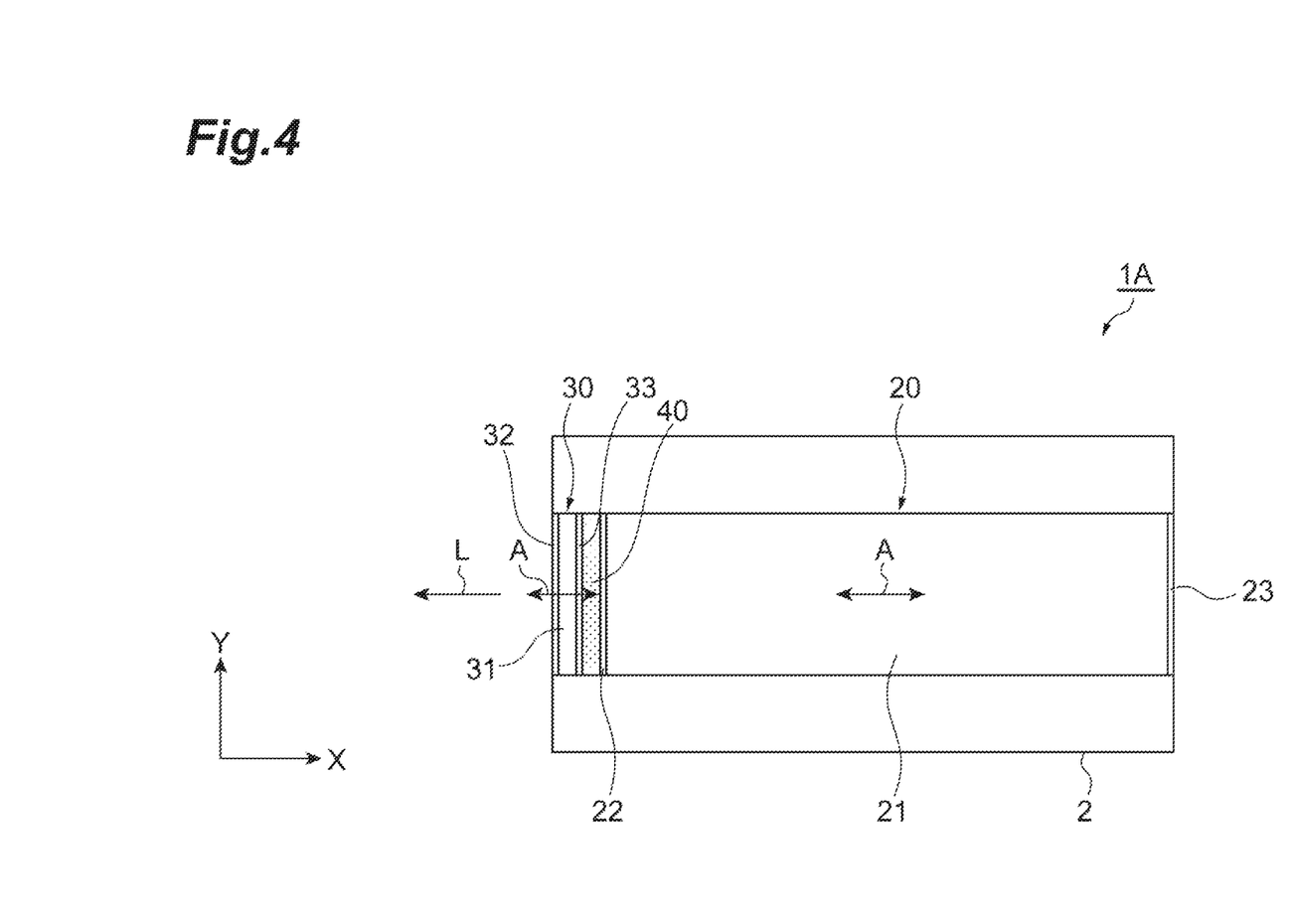
FIG. 4 is a plan view of an optical semiconductor element according to another embodiment.

An electrode 21 is disposed on a surface of the first optical waveguide body 20 opposite to the substrate 2. An electrode 31 is disposed on a surface of the second optical waveguide body 30 opposite to the substrate 2. An electrode (not illustrated) facing the electrode 21 and the electrode 31 is disposed on a rear surface of the substrate 2 (a surface of the substrate 2 opposite to the surface on which the first optical waveguide body 20 and the second optical waveguide body 30 are disposed). Accordingly, it is possible to separately apply biases to the first optical waveguide body 20 and the second optical waveguide body 30.

Low-reflection layers 22 and 23 are disposed on one end face and the other end face of the first optical waveguide body 20 in the X-axis direction. One end face and the other end face of the first optical waveguide body 20 are faces perpendicular to the light guiding direction A of the first optical waveguide body 20. Low-reflection layers 32 and 33 are disposed on one end face and the other end face of the second optical waveguide body 30 in the X-axis direction. One end face and the other end face of the second optical waveguide body 30 are faces perpendicular to the light guiding direction A of the second optical waveguide body 30. The configurations of the low-reflection layers 22, 23, 32, and 33 are the same as that of the low-reflection layer 9 of the above-mentioned optical semiconductor element 1.

A refractive index difference reducing layer 40 is disposed between the low-reflection layer 22 and the low-reflection layer 33 which face each other. The refractive index difference reducing layer 40 is formed of a material having a refractive index equivalent to that of the active layer 13 (i.e. a material having at least a smaller refractive index difference from the active layer 13 than that of air).

In the optical semiconductor element 1A having the above-mentioned configuration, a forward bias is applied to the first optical waveguide body 20. Accordingly, the first optical waveguide body 20 serves as a gain region, and the gain region as a laser diode oscillates light. However, resonance of light is curbed by the low-reflection layers 22 and 23. Accordingly, the first optical waveguide body 20 and the low-reflection layers 22 and 23 serve as an SLD and generate output light L with an excellent light condensing ability and a wide spectrum. The output light L is guided to the second optical waveguide body 30 via the low-reflection layer 22, the refractive index difference reducing layer 40, and the low-reflection layer 33. At this time, a forward bias and a reverse bias are alternately applied to the second optical waveguide body 30. Accordingly, the second optical waveguide body 30 serves as a modulation region and the modulation region modulates the output light L at a high speed. The output light L is emitted from the second optical waveguide body 30 via the low-reflection layer 32.

Figure 5:
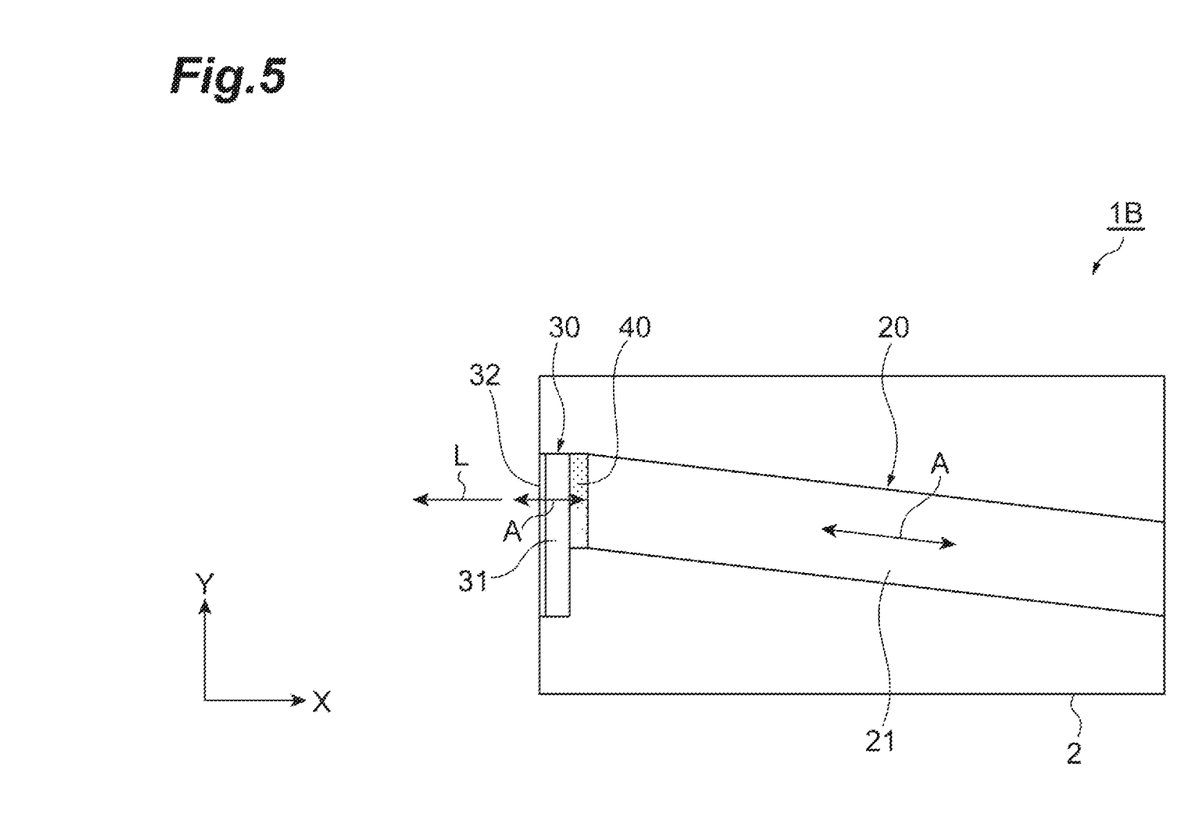
FIG. 5 is a plan view of an optical semiconductor element according to another embodiment.

The optical semiconductor element 1B illustrated in FIG. 5 includes a substrate 2, a first optical waveguide body 20, and a second optical waveguide body 30. The first optical waveguide body 20 and the second optical waveguide body 30 are arranged in the X-axis direction on the substrate 2.

The layer structure of each of the first optical waveguide body 20 and the second optical waveguide body 30 is the same as the layer structure of the optical waveguide body 10 of the optical semiconductor element 1. The light guiding direction A of the first optical waveguide body 20 is inclined with respect to the X-axis direction. The light guiding direction A of the second optical waveguide body 30 is parallel to the X-axis direction.

An electrode 21 is disposed on the surface of the first optical waveguide body 20 opposite to the substrate 2. An electrode 31 is disposed on the surface of the second optical waveguide body 30 opposite to the substrate 2. An electrode (not illustrated) facing the electrode 21 and the electrode 31 is disposed on the rear surface of the substrate 2 (the surface of the substrate 2 opposite to the surface on which the first optical waveguide body 20 and the second optical waveguide body 30 are disposed). Accordingly, it is possible to separately apply biases to the first optical waveguide body 20 and the second optical waveguide body 30.

One end face and the other end face of the first optical waveguide body 20 in the X-axis direction are faces which are perpendicular to the X-axis direction, but not faces which are perpendicular to the light guiding direction A of the first optical waveguide body 20, and are displaced from each other when viewed in the X-axis direction (an emission direction of output light L). One end face and the other end face of the second optical waveguide body 30 in the X-axis direction are faces which are perpendicular to the light guiding direction A of the second optical waveguide body 30. A low-reflection layer 32 is disposed on one end face of the second optical waveguide body 30 in the X-axis direction. The configuration of the low-reflection layer 32 is the same as the low-reflection layer 9 of the optical semiconductor element 1.

A refractive index difference reducing layer 40 is disposed without a break between one end face of the first optical waveguide body 20 and the other end face of the second optical waveguide body 30 which face each other. The refractive index difference reducing layer 40 is formed of a material having a refractive index equivalent to that of the active layer 13 (i.e. a material having at least a smaller refractive index difference from the active layer 13 than that of the air). In the optical semiconductor element 1B, the optical waveguide body may be electrically separated into a region corresponding to the first optical waveguide body 20 and a region corresponding to the second optical waveguide body 30 by forming an ion injection area for the optical waveguide body which is configured as a unified body.

In the optical semiconductor element 1B having the above-mentioned configuration, a forward bias is applied to the first optical waveguide body 20. Accordingly, the first optical waveguide body 20 serves as a gain region, and the gain region as a laser diode oscillates light. However, because one end face and the other end face of the first optical waveguide body 20 in the X-axis direction are not faces which are perpendicular to the light guiding direction A of the first optical waveguide body 20 and are displaced from each other when viewed in the X-axis direction (the emission direction of output light L), resonance of light is curbed. Accordingly, the first optical waveguide body 20 serves as an SLD and generates output light L with an excellent light condensing ability and a wide spectrum. The output light L is guided to the second optical waveguide body 30 via the refractive index difference reducing layer 40. At this time, a forward bias and a reverse bias are alternately applied to the second optical waveguide body 30. Accordingly, the second optical waveguide body 30 serves as a modulation region and the modulation region modulates the output light L at a high speed. The output light L is emitted from the second optical waveguide body 30 via the low-reflection layer 32.

Figure 6:
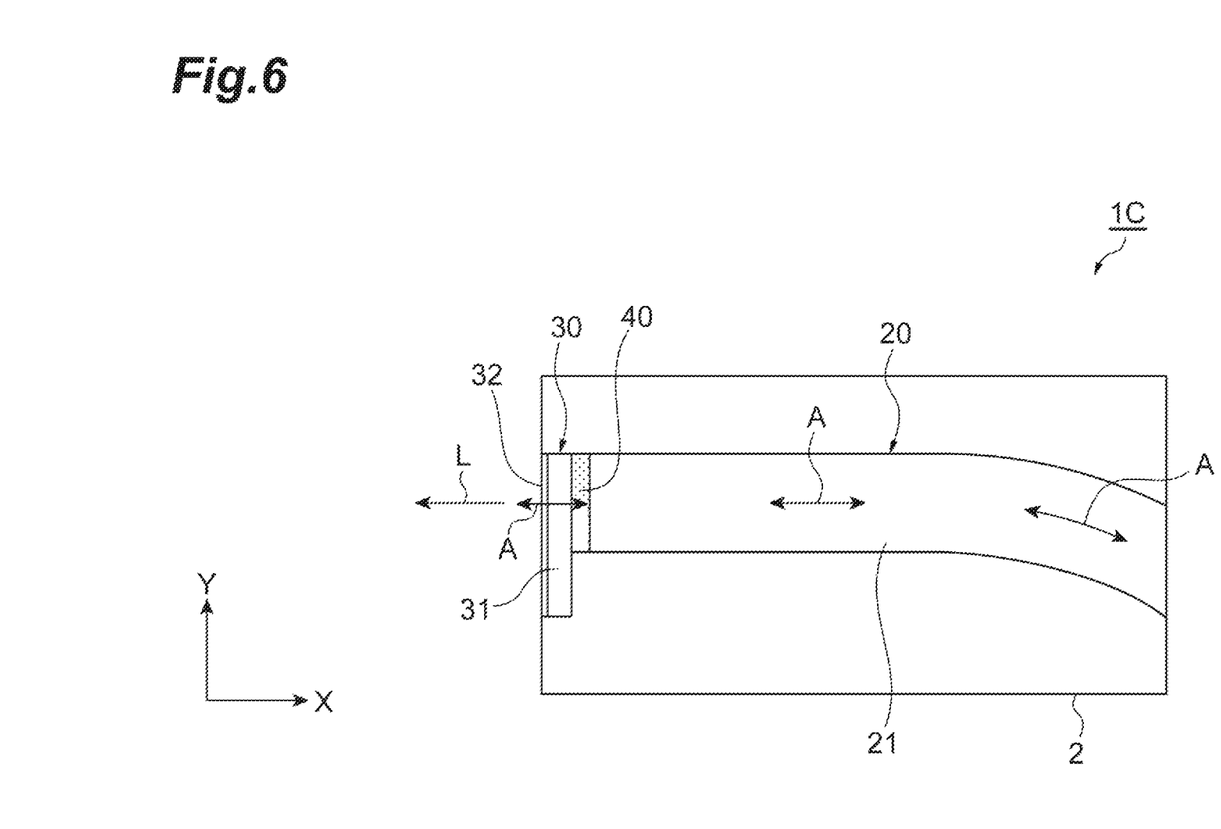
FIG. 6 is a plan view of an optical semiconductor element according to another embodiment.

An optical semiconductor element 1C illustrated in FIG. 6 includes a substrate 2, a first optical waveguide body 20, and a second optical waveguide body 30. The first optical waveguide body 20 and the second optical waveguide body 30 are arranged in the X-axis direction on the substrate 2. The layer structure of each of the first optical waveguide body 20 and the second optical waveguide body 30 is the same as the layer structure of the optical waveguide body 10 of the optical semiconductor element 1. The light guiding direction A of the first optical waveguide body 20 varies with respect to the X-axis direction. The light guiding direction A of the second optical waveguide body 30 is parallel to the X-axis direction.

An electrode 21 is disposed on the surface of the first optical waveguide body 20 opposite to the substrate 2. An electrode 31 is disposed on the surface of the second optical waveguide body 30 opposite to the substrate 2. An electrode (not illustrated) facing the electrode 21 and the electrode 31 is disposed on the rear surface of the substrate 2 (the surface of the substrate 2 opposite to the surface on which the first optical waveguide body 20 and the second optical waveguide body 30 are disposed). Accordingly, it is possible to separately apply biases to the first optical waveguide body 20 and the second optical waveguide body 30.

One end face of the first optical waveguide body 20 in the X-axis direction is a face which is perpendicular to the light guiding direction A in a part near the end face. The other end face of the first optical waveguide body 20 in the X-axis direction is not a face which is perpendicular to the light guiding direction A in a part near the other end face. One end face and the other end face of the first optical waveguide body 20 in the X-axis direction are displaced from each other when viewed in the X-axis direction (an emission direction of output light L). One end face and the other end face of the second optical waveguide body 30 in the X-axis direction are faces which are perpendicular to the light guiding direction A of the second optical waveguide body 30. A low-reflection layer 32 is disposed on one end face of the second optical waveguide body 30 in the X-axis direction. The configuration of the low-reflection layer 32 is the same as the low-reflection layer 9 of the optical semiconductor element 1.

A refractive index difference reducing layer 40 is disposed without a break between one end face of the first optical waveguide body 20 and the other end face of the second optical waveguide body 30 which face each other. The refractive index difference reducing layer 40 is formed of a material having a refractive index equivalent to that of the active layer 13 (i.e. a material having at least a smaller refractive index difference from the active layer 13 than that of the air). In the optical semiconductor element 1C, the optical waveguide body may be electrically separated into a region corresponding to the first optical waveguide body 20 and a region corresponding to the second optical waveguide body 30 by providing an ion injection area for the optical waveguide body which is configured as a unified body.

In the optical semiconductor element 1C having the above-mentioned configuration, a forward bias is applied to the first optical waveguide body 20. Accordingly, the first optical waveguide body 20 serves as a gain region, and the gain region as a laser diode oscillates light. However, because the other end face of the first optical waveguide body 20 in the X-axis direction is not a face which is perpendicular to the light guiding direction A in a part near the other end face and one end face and the other end face of the first optical waveguide body 20 in the X-axis direction are displaced from each other when viewed in the X-axis direction (the emission direction of output light L), resonance of light is curbed. Accordingly, the first optical waveguide body 20 serves as an SLD and generates output light L with an excellent light condensing ability and a wide spectrum. The output light L is guided to the second optical waveguide body 30 via the refractive index difference reducing layer 40. At this time, a forward bias and a reverse bias are alternately applied to the second optical waveguide body 30. Accordingly, the second optical waveguide body 30 serves as a modulation region and the modulation region modulates the output light L at a high speed. The output light L is emitted from the second optical waveguide body 30 via the low-reflection layer 32.

In the optical semiconductor element 1 according to the above-mentioned embodiment, the first region 101 and the second region 102 may be separated by an impurity diffusion region in which a deep level is formed by doping with impurities instead of the first ion injection region 17. The impurity diffusion region is formed by doping the optical waveguide body 10 with iron, oxygen, chromium, or the like, for example, by thermal diffusion or ion injection. Alternatively, in the optical semiconductor element 1 according to the above-mentioned embodiment, the first region 101 and the second region 102 may be separated by a semiconductor region of a conduction type different from that of the second clad layer 15 instead of the first ion injection region 17. For example, because the second clad layer 15 in the above-mentioned embodiment is formed of p-type semiconductor, the first region 101 and the second region 102 may be separated by an n-type semiconductor region. That is, a first separation region for separating the first region 101 and the second region 102 may be any one of an ion injection region, an impurity diffusion region, and a semiconductor region of a conduction type different from that of the second clad layer 15.

Similarly, in the optical semiconductor element 1 according to the above-mentioned embodiment, the first region 101 and the third region 103 may be separated by an impurity diffusion region instead of the second ion injection region 18. That is, a second separation region for separating the first region 101 and the third region 103 may be either one of an ion injection region and an impurity diffusion region. The first separation region and the second separation region may be constituted by different types of region. For example, one of the first separation region and the second separation region may be constituted by an ion injection region and the other thereof may be constituted by an impurity diffusion region. Even when at least one of the first separation region and the second separation region is constituted by a region other than the ion injection region, it is possible to generate output light L with an excellent light condensing ability and a wide spectrum and to modulate the output light L at a high speed, similarly to the optical semiconductor element 1 according to the above-mentioned embodiment. It is possible to further preferably realize electrical separation of the first region 101 and the second region 102 and electrical separation of the first region 101 and the third region 103.

The optical semiconductor element 1 according to the above-mentioned embodiment may be configured as in a first modified example which will be described below. In the first modified example, the optical semiconductor element 1 is formed of nitride semiconductor. The substrate 2 is formed of, for example, a GaN (0001) substrate. The buffer layer 3 is formed of, for example, Si-doped GaN. The first clad layer 11 is formed of, for example, Si-doped $Al_{0.077}Ga_{0.923}N$. The first guide layer 12 is formed of, for example, non-doped GaN. The active layer 13 has, for example, a double quantum well structure of InGaN. More specifically, the active layer 13 includes, for example, an $In_{0.043}Ga_{0.957}N$ well layer and a GaN barrier layer. The second guide layer 14 is formed of, for example, non-doped GaN. The second clad layer 15 is formed of, for example, Mg-doped $Al_{0.077}Ga_{0.923}N$. The contact layer 16 is formed of, for example, Mg-doped GaN. A carrier block layer forming of, for example, Mg-doped $Al_{0.209}Ga_{0.791}N$ may be disposed between the second guide layer 14 and the second clad layer 15.

The optical semiconductor element 1 according to the above-mentioned embodiment outputs output light L in a near infrared area, and the optical semiconductor element 1 according to the first modified example outputs output light L in an ultraviolet area and/or a visible area. In the optical semiconductor element 1 according to the first modified example, a first bias and a second bias which are reverse biases are alternately applied between the fourth electrode 8 and the third electrode 7. Specifically, two negative voltages having different voltage values are alternately applied to the third electrode 7 with the fourth electrode 8 set to the ground potential in cycles at a subnanosecond level. Accordingly, the third region 103 serves as a modulation region and the modulation region modulates the output light L at a high speed. This point will be additionally described below with reference to FIGS. 7 and 8.

In the optical semiconductor element 1 according to the first modified example, the layers of the optical waveguide body 10 are formed on a Ga face (+c face) of the substrate 2 formed of a GaN (0001) substrate by crystal growth. That is, a crystal face on which the layers of the optical waveguide body 10 are formed is the Ga face of the substrate 2. Because the Ga face is a polar face, spontaneous polarization and piezoelectric polarization due to a strain are generated on the Ga face.

Figure 7:
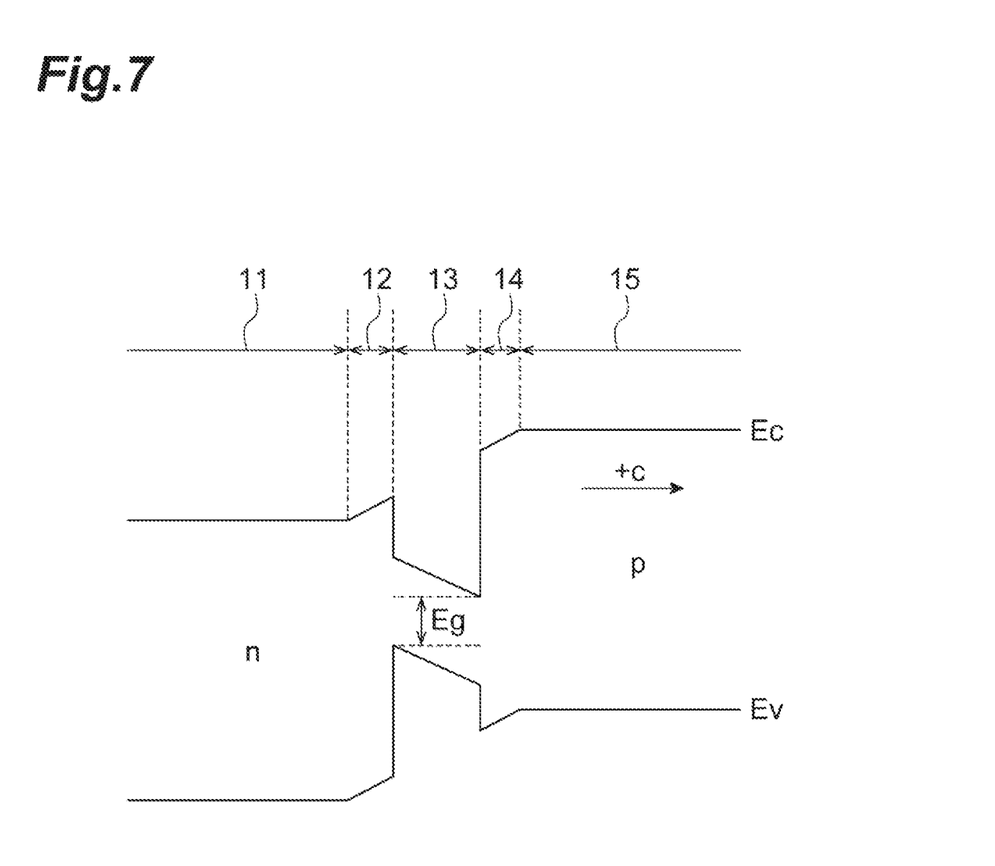
FIG. 7 is a diagram illustrating an energy band in an optical semiconductor element according to a first modified example.
Figure 8:
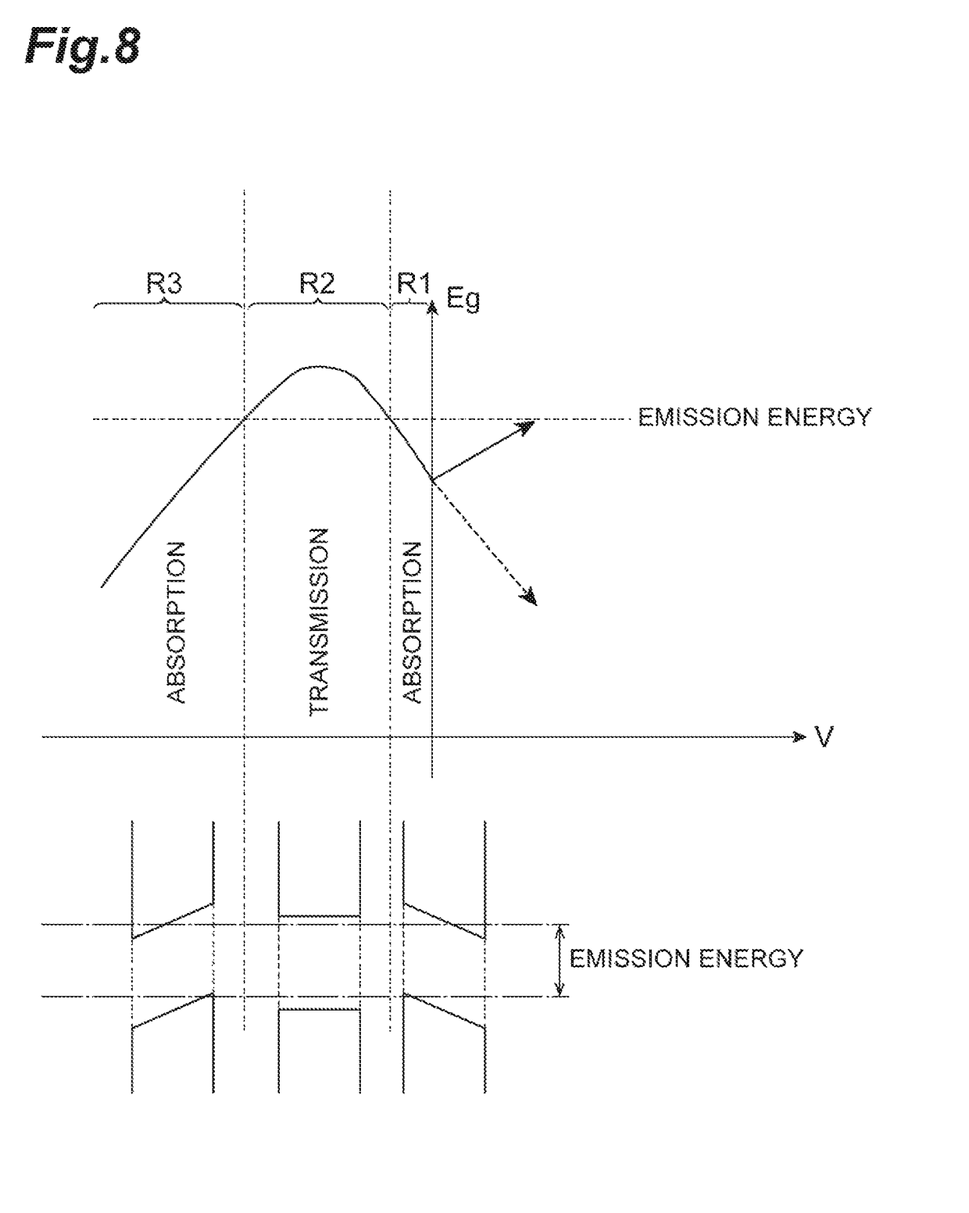
FIG. 8 is a diagram illustrating a relationship between a bias and a band gap in the optical semiconductor element according to the first modified example.

A lattice constant of the active layer 13 formed of InGaN is larger than a lattice constant of GaN. Accordingly, the active layer 13 is subjected to a compressive strain. As a result, as illustrated in FIG. 7, an energy band drops in the +c direction in the first modified example. When a forward bias is applied between the fourth electrode 8 and the third electrode 7, polarization is screened (curbed) by injection of carriers and the energy band becomes flat. A gap of the flat energy band corresponds to emission energy. As illustrated in FIG. 8, in a section R1 in which a reverse bias applied between the fourth electrode 8 and the third electrode 7 is small (the absolute value of the bias is small) or zero, a superficial band gap decreases due to polarization and the third region 103 serves as an absorption region (a loss region).

In a section R2 in which the reverse bias applied between the fourth electrode 8 and the third electrode 7 is larger than that in the section R1, the energy band becomes flat and the superficial band gap increases. Accordingly, the third region 103 serves as a transmission region (a gain region). In a section R3 in which the reverse bias applied between the fourth electrode 8 and the third electrode 7 is larger than that in the section R2, the energy band rises in the +c direction and the superficial band gap decreases. Accordingly, the third region 103 serves as an absorption region.

In the first modified example, a first bias for causing the third region 103 to serve as a transmission region and a second bias for causing the third region 103 to serve as an absorption region are alternately applied between the fourth electrode 8 and the third electrode 7. Accordingly, the third region 103 can serve as a modulation region. The first bias is a reverse bias included in the section R2. The second bias may be a reverse bias included in the section R1 or may be a reverse bias included in the section R3. In this way, in the first modified example, similarly to the above-mentioned embodiment, the magnitudes of the first bias and the second bias are different from each other. When magnitudes of two biases are different from each other, this means that the magnitudes including plus and minus values are different from each other, not the magnitudes of the absolute values are different from each other. In the first modified example, the reverse bias applied to the second region 102 is a reverse bias included in the section R1 or the section R3.

According to the first modified example, similarly to the optical semiconductor element 1 according to the above-mentioned embodiment, it is possible to generate output light L with an excellent light condensing ability and a wide spectrum and to modulate the output light L at a high speed.

The optical semiconductor element 1 according to the above-mentioned embodiment may be configured as a second modified example which will be described below. In the optical semiconductor element 1 according to the second modified example, the layers of the optical waveguide body 10 are formed on an N face (−c face) of the substrate 2 formed of a GaN (0001) substrate. The other points are the same as in the first modified example.

Figure 9:
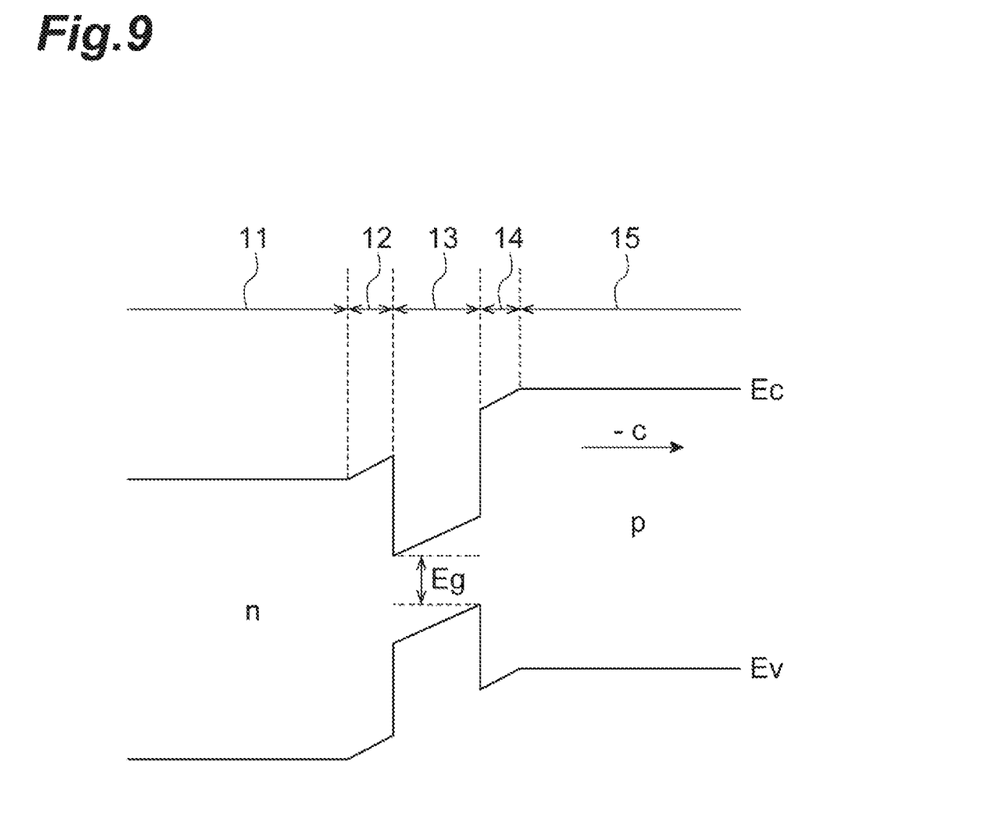
FIG. 9 is a diagram illustrating an energy band in an optical semiconductor element according to a second modified example.
Figure 10:
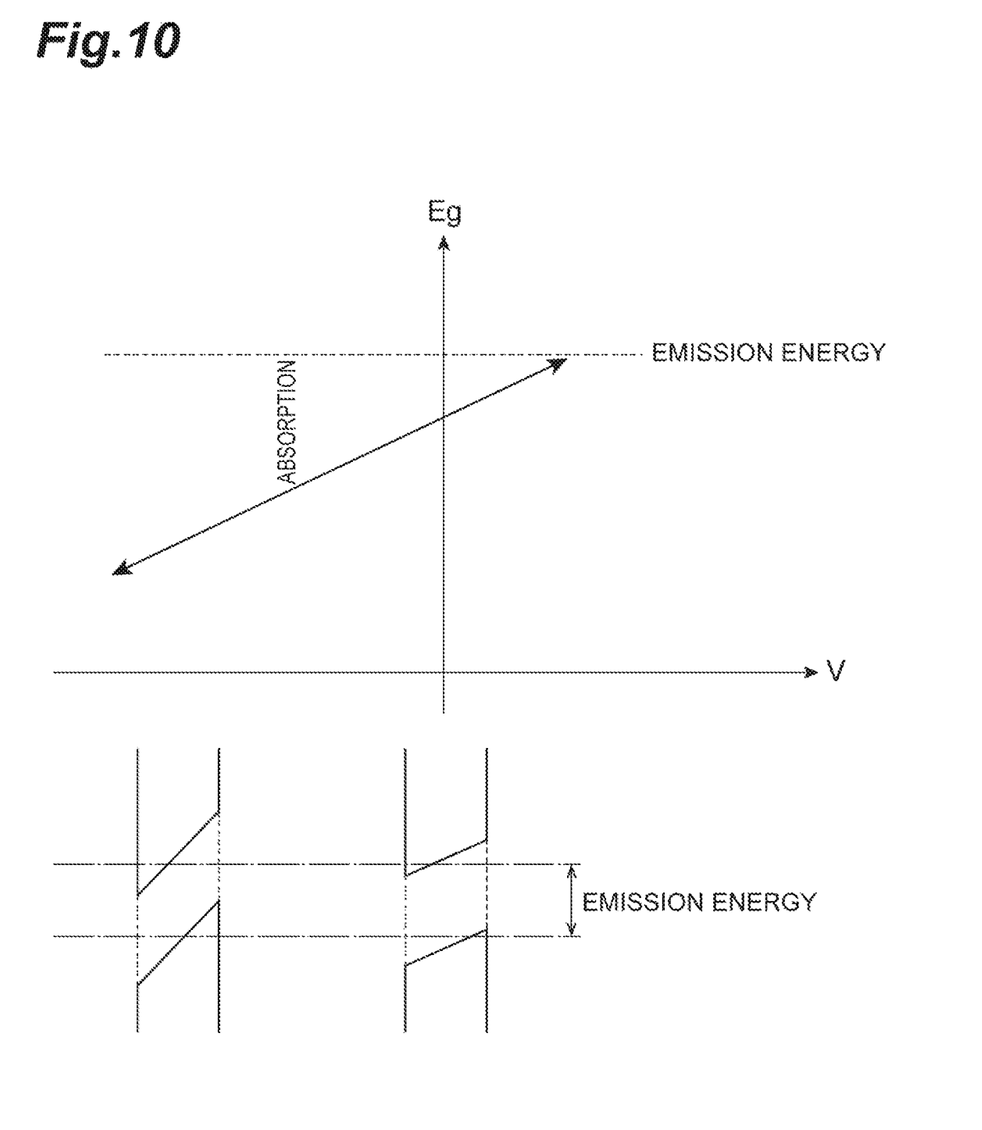
FIG. 10 is a diagram illustrating a relationship between a bias and a band gap in the optical semiconductor element according to the second modified example.

As illustrated in FIG. 9, in the second modified example, an energy band rises in the −c direction (that is, an energy band decreases in the +c direction). Accordingly, as illustrated in FIG. 10, in a section in which a reverse bias is applied between the fourth electrode 8 and the third electrode 7, the third region 103 serves as an absorption region. Accordingly, similarly to the above-mentioned embodiment, the third region 103 can serve as a modulation region by alternately applying a forward bias and a reverse bias between the fourth electrode 8 and the third electrode 7. Accordingly, according to the second modified example, similarly to the optical semiconductor element 1 according to the above-mentioned embodiment, it is possible to generate output light L with an excellent light condensing ability and a wide spectrum and to modulate the output light L at a high speed.

As another modification, the layers of the optical waveguide body 10 in the first modified example may be formed on a nonpolar or semipolar face of the substrate 2. An example of the nonpolar face is a (1-100) face of the substrate 2 formed of a GaN (0001) substrate. In this case, because it is not affected by polarization, the third region 103 can serve as a modulation region by alternately applying a forward bias and a reverse bias between the fourth electrode 8 and the third electrode 7 similarly to the above-mentioned embodiment.

What is claimed is:

1. An optical semiconductor element comprising:
    an optical waveguide body that is configured as a double heterostructure including an active layer and a first clad layer and a second clad layer between which the active layer is interposed;
    a first electrode that is disposed on the second clad layer;
    a second electrode that is disposed on the second clad layer on one side of the first electrode in a light guiding direction of the optical waveguide body;
    a third electrode that is disposed on the second clad layer on other side of the first electrode in the light guiding direction of the optical waveguide body; and
    at least one fourth electrode that faces the first electrode, the second electrode, and the third electrode with the optical waveguide body interposed therebetween,
    wherein the optical waveguide body includes a first separation region that electrically separates a first region under the first electrode from a second region under the second electrode and a second separation region that electrically separates the first region under the first electrode and a third region under the third electrode,
    wherein the first region serves as a gain region by applying a forward bias between the first electrode and the at least one fourth electrode,
    wherein the second region serves as a loss region by applying a reverse bias between the second electrode and the at least one fourth electrode,
    wherein the third region serves as a modulation region by alternately applying a first bias and a second bias having different magnitudes between the third electrode and the at least one fourth electrode, and
    wherein at least a part of the second electrode and at least a part of the third electrode are arranged on a straight line parallel with a direction in which light travels in the first region.

2. The optical semiconductor element according to claim 1, wherein each of the first separation region and the second separation region includes an ion injection region, an impurity diffusion region, or a semiconductor region of a conduction type different from the conduction type of the second clad layer.

3. The optical semiconductor element according to claim 1, wherein each of the first separation region and the second separation region extends from a surface of the second clad layer to the first clad layer.

4. The optical semiconductor element according to claim 1, wherein the first bias is a forward bias and the second bias is a reverse bias.

5. The optical semiconductor element according to claim 1, wherein the first bias and the second bias are reverse biases.

6. The optical semiconductor element according to claim 1, wherein an end face on a side opposite to the first region in the third region is a face perpendicular to the light guiding direction.

7. The optical semiconductor element according to claim 1, wherein a low-reflection layer is disposed on an end face on a side opposite to the first region in the third region.

8. The optical semiconductor element according to claim 1, further comprising a substrate on which the optical waveguide body is disposed.

9. The optical semiconductor element according to claim 8, wherein the optical waveguide body is formed in a ridge structure on the substrate.

10. The optical semiconductor element according to claim 1, wherein a length of the third region in the light guiding direction is shorter than a length of the first region and of the second region in the light guiding direction.

* * * * *